United States Patent
Nishikido (10) Patent No.: US 6,985,540 B2
(45) Date of Patent: Jan. 10, 2006

(54) AM DEMODULATOR

(75) Inventor: Osamu Nishikido, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 792 days.

(21) Appl. No.: 09/985,772

(22) Filed: Nov. 6, 2001

(65) Prior Publication Data

US 2002/0196870 A1 Dec. 26, 2002

(30) Foreign Application Priority Data

Jun. 26, 2001 (JP) ............................. 2001-192860

(51) Int. Cl.
- *H03D 1/24* (2006.01)
- *H04L 27/14* (2006.01)
- *H04L 27/16* (2006.01)
- *H04L 27/22* (2006.01)

(52) U.S. Cl. ...................... 375/320; 375/376; 375/116; 375/324; 329/347; 332/115

(58) Field of Classification Search ................ 455/275; 375/376, 320, 116; 329/347; 348/726; 332/115
See application file for complete search history.

(56) References Cited

U.S. PATENT DOCUMENTS

| | | | | |
|---|---|---|---|---|
| 3,984,778 A | * | 10/1976 | Bhopale | ...................... 375/321 |
| 4,253,189 A | * | 2/1981 | Lemoussu et al. | .......... 375/320 |
| 5,465,411 A | * | 11/1995 | Koike | ........................ 455/275 |
| 5,557,648 A | * | 9/1996 | Ishihara | ...................... 375/376 |
| 6,803,815 B1 | * | 10/2004 | Nishikido | ................... 329/347 |
| 2001/0013814 A1 | * | 8/2001 | Arisawa | ...................... 332/115 |
| 2002/0191117 A1 | * | 12/2002 | Matsugaki et al. | ......... 348/726 |
| 2005/0036254 A1 | * | 2/2005 | Premerlani et al. | ........... 361/69 |

FOREIGN PATENT DOCUMENTS

JP          6-6139          1/1994

* cited by examiner

*Primary Examiner*—Stephen Chin
*Assistant Examiner*—Linda Wong
(74) *Attorney, Agent, or Firm*—Leydig, Voit & Mayer, Ltd.

(57) ABSTRACT

An AM demodulator includes an APC detection circuit that compares phases of an AM-modulated input signal and a signal output from a VCO. However, the APC detection circuit multiples the two signals before their comparison. As a result, even if the phases of the input signal or the signal output from the VCO is shifted by 180 degrees, the result of comparison by the APC detection circuit is not influenced by the phase shift. Moreover, when a signal detected by the AM detection circuit is in a potential range showing overmodulation, operation of a PLL circuit is stopped.

6 Claims, 10 Drawing Sheets

INPUT SIGNAL

FIG.2B

PHASE
DIFFERENCE 0°

NON-SIGNAL POTENTIAL

FIG.2C

NON-SIGNAL POTENTIAL

PHASE
DIFFERENCE 180°

FIG.3

FIG.4A
INPUT SIGNAL

FIG.4B
PHASE
DIFFERENCE 0° ----- NON-SIGNAL POTENTIAL

FIG.4C
PHASE
DIFFERENCE 90° ----- NON-SIGNAL POTENTIAL

FIG.4D
PHASE
DIFFERENCE 180° ----- NON-SIGNAL POTENTIAL

FIG.4E
PHASE
DIFFERENCE 270° ----- NON-SIGNAL POTENTIAL

BACKGROUND ART

FIG.11A

INPUT SIGNAL

FIG.11B

IDEAL OUTPUT

FIG.11C

ACTUAL OUTPUT

AM DEMODULATOR

FIELD OF THE INVENTION

This invention relates to an amplitude modulation ("AM") demodulator using a Phase Locked Loop ("PLL"). More specifically, the invention relates to an AM demodulator which is capable of obtaining a stable detection output from an input signal at the time of over-modulation.

BACKGROUND OF THE INVENTION

Figure 10:
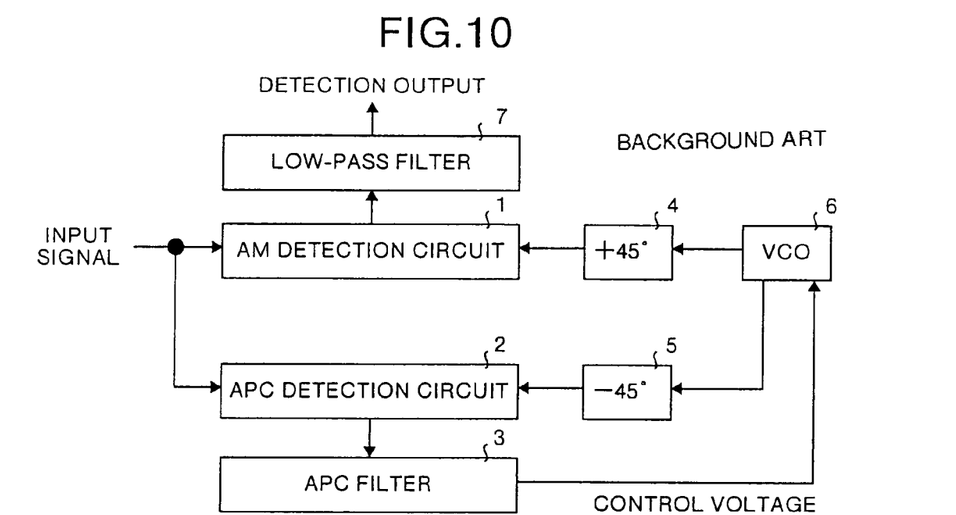
FIG. 10 is a block diagram showing a schematic structure of one example of a conventional AM demodulator.

FIG. 10 is a block diagram showing a schematic structure of one example of a conventional AM demodulator. This conventional AM demodulator is composed of the AM detection circuit 1, automatic phase control ("APC") detection circuit 2, APC filter 3, phase shift circuits 4 and 5, voltage control oscillator ("VCO") 6, and the low-pass filter 7.

Operation of this conventional AM demodulator will now be explained. An AM-modulated input signal is input into the AM detection circuit 1. The AM detection circuit 1 receives this input signal and a signal output from the phase shift circuit 4 multiplies the two input signals, and outputs the result of multiplication. The phase shift circuit 4 receives a signal output from the voltage control oscillator (VCO) 6 and shifts the phase of the received input signal by +45 degrees. The low-pass filter 7 separates a high-frequency component from a signal received from the AM detection circuit 1, and outputs the separated high-frequency component as a detection output.

The VCO 6 receives a control voltage output by the APC filter 3, and outputs a signal of an oscillation frequency according to the received control voltage. The APC filter 3 receives and smoothes a signal output by the APC detection circuit 2 so as to convert the received signal into a DC voltage. The APC detection circuit 2 receives the AM-modulated input signal and a signal output by the phase shift circuit 5. The APC detection circuit 2 compares phases of the two received signals and outputs a signal that indicates a difference between the two received signals. The phase shift circuit 5 receives a signal output by the VCO 6, and shifts a phase of the received signal by −45 degrees. Thus, the APC detection circuit 2, APC filter 3, phase shift circuit 5, and the VCO 6 constitute a PLL. This PLL generates a detection signal that is synchronized with a carrier of the received AM-modulated signal.

Particularly, in this PLL, the detection signal generated by the PLL, namely, the signal other than the AM-modulated input signal input into the AM detection circuit 1 has the same frequency and phase as the carrier of the AM-modulated input signal. As a result, the AM detection circuit 1 can separate a signal from the AM-modulated input signal that is synchronized with the detection signal, and the low-pass filter 7 outputs the separated signal as a wave to be modulated, namely, the detection output.

Television broadcasting or the like is not transmitted with a regular percentage modulation and is occasionally transmitted with a percentage modulation which exceeds 100% in some broadcasting stations. However, in the AM demodulator, when the input signal that has been over-modulated is input, there occurs a phenomenon that a detection output that is disadvantageously inverted is output.

Figure 11A:
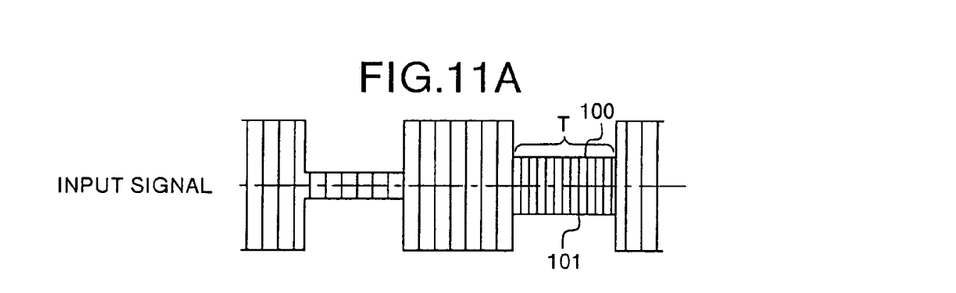
FIG. 11A to FIG. 11C are explanatory diagrams for explaining inversion of an output which occurs at the time of over-modulation.
Figure 11B:
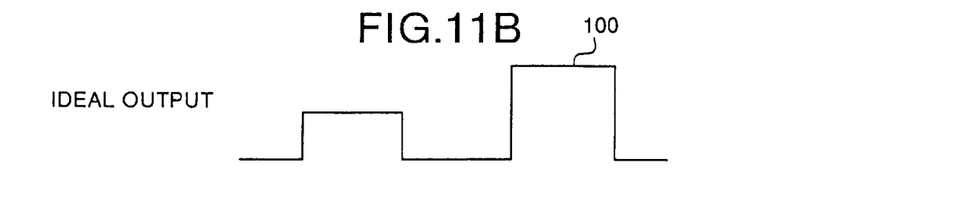
Figure 11C:
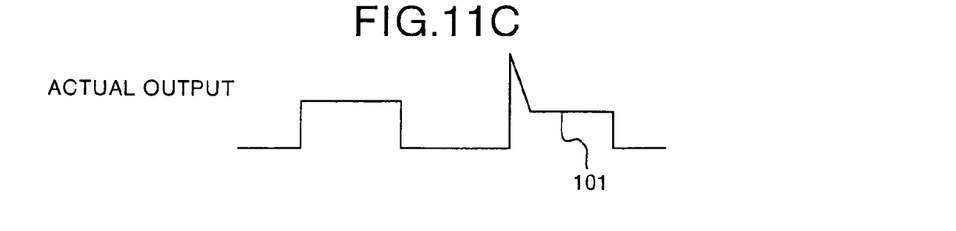

This phenomenon will be explained in detail below. FIG. 11A to FIG. 11C are explanatory diagrams for explaining the inversion of the output which occurs at the time of over-modulation. When a waveform on the side lower than a center of the carrier (the broken line in the figures) is detected, as shown in FIG. 11A, since an amplitude of the wave to be modulated becomes larger than an amplitude of the carrier at over-modulation period T, a peak 100 of the wave to be modulated is in a position which exceeds the center of the carrier. Namely, in the AM demodulator, ideally, an envelope shown in FIG. 11B should be output as the detection output for the input signal (i.e. AM-modulated signal) shown in FIG. 11A.

However, since the phase of the carrier of the input signal is shifted by 180 degrees at a over-modulation period T, in the AM demodulator, the phases of the two signals received by the APC detection circuit 2 are also shifted by 180 degrees from the original states. The APC detection circuit 2 controls the VCO 6 so the original phase relationship is returned in order to follow the phase change of 180 degrees. As a result, a signal which is obtained by shifting the carrier of the input signal and the output of the VCO 6 by +45 are also shifted by 180 degrees.

In other words, in the conventional AM demodulator, in order to follow the phase change, the detection signal with a phase shifted by 180 degrees from a desired phase relationship is generated by PLL, and this detection signal is used for detection. As a result, as shown in FIG. 11C, a peak 101 in a position inverted with respect to the peak 100 at over-modulation period T of FIG. 11A is output as the detection output.

In order to prevent such inversion of the detection output, countermeasures are taken by providing means for stopping the PLL control at the time of over-modulation, or means for reducing speed of the PLL control. Because of provision of such means, following of the phase change due to the over-modulation can be prevented. However, with these countermeasures, the APC detection circuit 2 hardly operates at the time of over-modulation, and there arises a problem that stability at the time of over-modulation deteriorates.

SUMMARY OF THE INVENTION

It is an object of the present invention to provide an AM demodulator in which even if an input signal that has been over-modulated is input, a detection output is not inverted without stopping an operation of an APC detection circuit 2.

The AM demodulator according to one aspect of the present invention receives and demodulates an AM modulated input signal using a wave-detection signal generated by a phase lock loop. The AM demodulator comprises: a detection unit which detects whether the detection signal when it detects that a signal obtained by AM wave-detection of the wave-detection signal has a predetermined relationship with respect to a predetermined amplitude level; a first multiplying unit which raises the input signal to 2n-th power, where n is an integer equal to or greater than 1; a voltage control oscillator which output the wave-detection signal; a second multiplying unit which raises the wave-detection signal output from the voltage control oscillator to 2n-th power; a phase control unit performs phase control using the outputs of the first and second multiplying units; and a switching unit which resets the phase lock loop comprising the detection unit, first and second multiplying units, and the phase control unit according to the detection signal.

The AM demodulator according to another aspect of the present invention receives and demodulates an AM modulated input signal using a wave-detection signal generated by a phase lock loop. The AM demodulator comprises: a detection unit which detects whether the detection signal when it detects that a signal obtained by AM wave-detection of the wave-detection signal has a predetermined relationship with respect to a predetermined amplitude level; a first multiplying unit which raises the input signal to 2n-th power, where n is an integer equal to or greater than 1; a voltage control oscillator which output the wave-detection signal; a second multiplying unit which raises the wave-detection signal output from the voltage control oscillator to 2n-th power; a first phase control unit performs phase control using the outputs of the first and second multiplying units; a second phase control unit performs phase control using the wave-detection signal output from the voltage control oscillator; a filter unit which generates a signal for controlling the voltage control oscillator; and a selection unit which selects a signal output from either the first phase control unit or the second phase control unit according to the detection signal and provided the selected signal to the filter unit.

The AM demodulator according to still another aspect of the present invention receives and demodulates an AM modulated input signal using a wave-detection signal generated by a phase lock loop. The AM demodulator comprises: a detection unit which detects whether the detection signal when it detects that a signal obtained by AM wave-detection of the wave-detection signal has a predetermined relationship with respect to a predetermined amplitude level; a first multiplying unit which raises the input signal to 2n-th power, where n is an integer equal to or greater than 1; a voltage control oscillator which output the wave-detection signal; a second multiplying unit which raises the wave-detection signal output from the voltage control oscillator to 2n-th power; a first phase control unit performs phase control using the outputs of the first and second multiplying units; a second phase control unit performs phase control using the wave-detection signal output from the voltage control oscillator; a filter unit which generates a signal for controlling the voltage control oscillator; and a switching unit which provided a signal output by the second phase control unit to the filter unit according to the detection signal.

Other objects and features of this invention will become apparent from the following description with reference to the accompanying drawings.

DESCRIPTION OF THE PREFERRED EMBODIMENTS

Embodiments of the AM demodulator of the present invention with reference to the accompanying drawings. However, the invention is not limited to the embodiments.

There will be explained below an AM demodulator according to a first embodiment. The AM demodulator according to the first embodiment is characterized in that when two signals which are compared in an APC detection circuit are squared, even in the case where a phase of an input signal or a phase of a signal output from VCO is shifted by 180 degrees, the phase shift does not influence the compared result of the APC detection circuit and that in the case where a signal detected by the AM detection circuit exceeds a predetermined potential showing over-modulation, an operation of PLL is reset.

Figure 1:
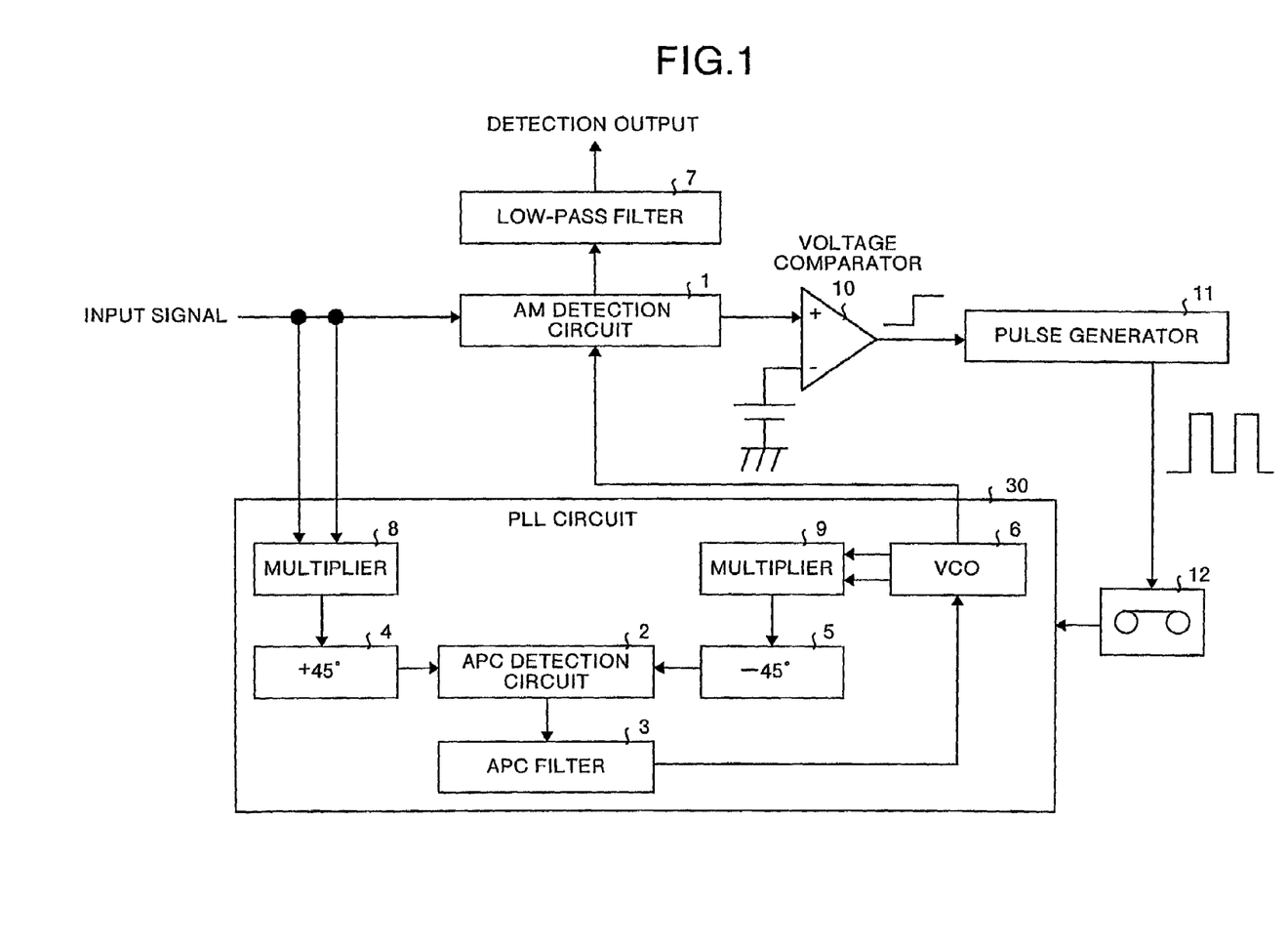
FIG. 1 is a block diagram showing a schematic structure of an AM demodulator according to a first embodiment.

FIG. 1 is a block diagram showing a schematic structure of the AM demodulator according to the first embodiment. In FIG. 1, the same reference numerals are given to the parts which are common with FIG. 10, and the explanation thereof is omitted. The difference between the structure shown in FIG. 1 and that shown in FIG. 10 is, that the phase shift circuit 4 interposed between the VCO 6 and the AM detection circuit 1 is arranged at the previous state of an input of the APC detection circuit 2. Moreover, the multipliers 8 and 9, voltage comparator 10, pulse generator 11, and the switch 12 are additionally provided. The multiplier 8 squares an input signal so as to output it to the phase shift circuit 4. The multiplier 9 squares a signal output from the VCO 6 so as to output it to the phase shift circuit 5. The voltage comparator 10 compares a detection result output from the AM detection circuit 1 with a predetermined voltage level. The pulse generator 11 generates a pulse according to the compared result output from the voltage comparator 10. The switch 12 cuts off a loop of PLL according to the pulse output from the pulse generator 11.

In the AM demodulator according to the present invention, the APC detection circuit 2, APC filter 3, phase shift circuits 4 and 5, VCO 6, and the multipliers 8 and 9 constitute the PLL circuit 30.

Operation of the AM demodulator will now be explained. An AM-modulated input signal is input into the AM detection circuit 1 and into the multiplier 8 composing the PLL circuit 30. The multiplier 8 multiplies signals input in to two input terminals so as to output the multiplied signal. However, a terminal to which the input signal is input is connected to both the two input terminals so that the result obtained by squaring the input signal is output.

The effect of squaring of the input signal will be explained in detail below. In general, in an operation expression for squaring a signal represented by cos A, the following relationship is established:

$$\cos A \times \cos A = \cos(A+180 \text{ degrees}) \times \cos(A+180 \text{ degrees}) = (\cos 2A + 1)/2.$$

Namely, as for the signal cos A and the signal cos (A+180 degrees), a phase of which is shifted by 180 degrees from a phase of the signal cos A, the results of squaring them can be represented by an equation of isophase (2A) where a frequency is doubled. In other words, a difference due to a phase shift of 180 degrees between a signal with certain phase and a signal, a phase of which is shifted by 180 degrees from the signal can be ignored by squaring the signals.

This means that even if the input signal is shifted by 180 degrees at the time of over-modulation, a phase of the squared signal is not changed. Namely, in FIG. 1, even in the case where the phase of the input signal is shifted by 180 degrees due to over-modulation, the signal output from the multiplier 8 is the same as a signal in the case where the phase is not shifted by 180 degrees.

Meanwhile, a signal output from the VCO 6 is input into the multiplier 9. Similarly to the multiplier 8, the multiplier 9 is also means for multiplying the signals input into the two input terminals so as to output the multiplied result. However, an output terminal of the VCO 6 is connected to both the two input terminals, and the signal output from the VCO 6 is squared so that the squared result is output.

The phase shift circuit 4 shifts the phase of the signal output from the multiplier 8 by +45 degrees, and the signal with shifted phase is input into the APC detection circuit 2. Moreover, the phase shift circuit 5 shifts the phase of the signal output from the multiplier 9 by −45 degrees, the signal with shifted phase is input into the APC detection circuit 2. The APC detection circuit 2, the APC filter 3 and the VCO 6 perform the conventional PLL operation. Eventually, in the PLL circuit 30 shown in FIG. 1, the VCO 6 is controlled so that the phase of one signal input into the APC detection circuit 2, namely, the signal output from the phase shift circuit 4 and the phase of other signal input into the APC detection circuit 2, namely, the signal output from the phase shift circuit 5 are shifted by −90 degrees and both the signals have the same frequency.

Therefore, even in a period in which the AM demodulator receives an over-modulated input signal, the APC detection circuit 2 maintains the state. Namely, even if the over-modulated input signal is received, the phase of the detection signal which is output from the VCO 6 and is input into the AM detection circuit 1 is not inverted.

However, even if the phase of the detection signal generated in the PLL circuit 30 is not inverted by 180 degrees, when the input signal input into the AM detection circuit 1 is of over-modulation, the phase of the carrier of the input signal is inverted by 180 degrees. For this reason, finally between both the signals input into the AM detection circuit 1, a phase difference of 0 degrees or 180 degrees is generated. Particularly in the case where the phase difference of 180 degrees is generated, the detection output is possibly locked in a state that it is inverted with respect to an ideal output.

This phenomenon will be explained in detail below. The AM-modulated input signal (vam) is normally represented as:

$$vam=\{Vc+Vs\times\cos\{\omega Sxt\}\}\times\cos\{\omega cxt\}.$$

Here, $Vc \times \cos\{\omega cxt\}$ represents a carrier, and $Vs \times \cos\{\omega sxt\}$ represents a signal wave form as a wave to be modulated.

In the AM demodulator, the input signal vam is multiplied by a detection signal $V0 \times \cos\{\omega cxt\}$ with the same phase as the carrier so as to be detected. With this multiplication, an output vout of the AM detection circuit 1 becomes:

$$vout=V0\times Vc/2+V0\times Vs\times\cos\{\omega Sxt\}/2+\{Vc+Vs\times\cos\{\omega Sxt\}\}\times\cos\{2\times\omega cxt\}/2.$$

Meanwhile, in the case where an input signal vam' with phase difference of 180 degrees is detected by using the same detection signal $V0\times\cos\{\omega cxt\}$, an output vout' of the AM detection circuit 1 becomes:

$$vout'=-vout.$$

Figure 2A:
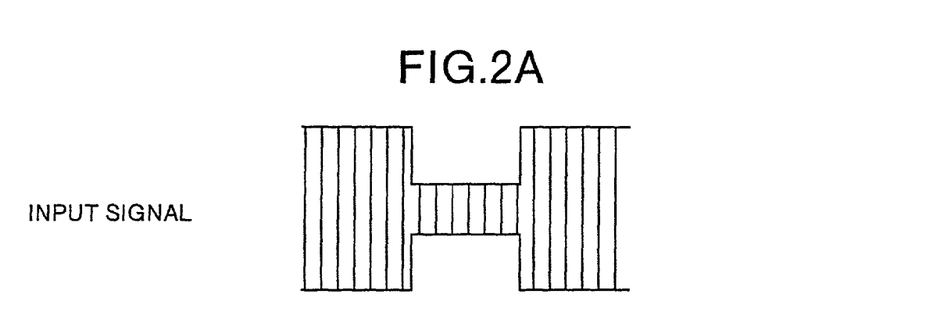
FIG. 2A to FIG.2C are explanatory diagrams for explaining a signal to be output from an AM detection circuit in the AM demodulator according to the first embodiment.
Figure 2B:
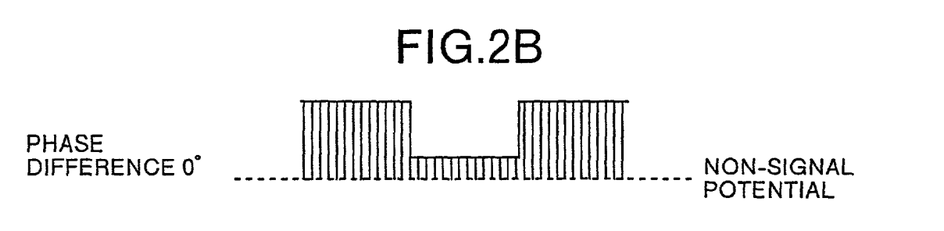

When PLL is locked for the input signal with phase difference of 0 degrees or the input signal with phase difference of 180 degrees, the signal output from the AM detection circuit 1 is inverted up and down. FIG. 2A to FIG. 2C are explanatory diagrams for explaining a signal output from the AM detection circuit 1 in the AM demodulator according to the first embodiment. When the input signal shown in FIG. 2A is in a state that the inversion due to over-modulation does not occur, namely, the phase difference of the signal is 0 degrees, the input signal is detected by the detection signal with the same phase. As shown in FIG. 2B, a portion which is higher than a non-voltage potential is output as a detection waveform.

Figure 2C:
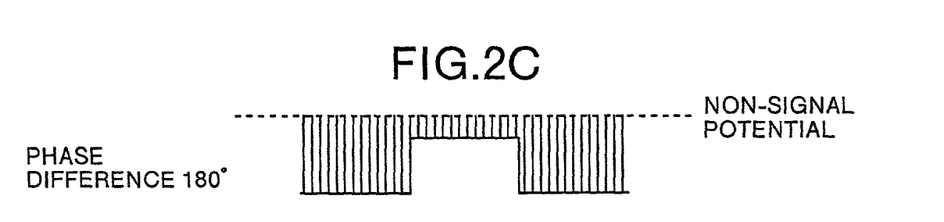

On the contrary, in the case where the input signal shown in FIG. 2A is in a state that the inversion due to over-modulation occurs, namely, the phase difference of the input signal is 180 degrees, the input signal is detected by a detection signal with inverted phase. As shown in FIG. 2C, a portion which is lower than the non-signal potential is output as a detection waveform.

In such a state, in the PLL circuit 30 there exists two points at which the signal output from the VCO 6, namely, the detection signal is locked by the PLL circuit 30, has the same phase and the phase shifted by 180 degrees as and from the phase of the input signal. For this reason, the detected result is possibly inverted with respect to the objective signal wave. In order to prevent this phenomenon, in the first embodiment, the voltage comparator 10, the pulse generator 11 and the switch 12 are provided as the components of the AM demodulator. There will be explained below operations of these components.

In the AM demodulator, there considers the case where a waveform on the lower side than the non-signal potential, namely, the case where detection is made by using the detection signal, the phase of which is shifted by 180 degrees from the input signal. Namely, as shown in FIG. 2B, the state that the detected result is inverted is a waveform inverted to a potential side higher than the non-signal potential.

Therefore, the signal output from the AM detection circuit 1 is input into a non-inversion input terminal of the voltage comparator 10, and the voltage comparator 10 is set so as to perform the following operation. When the input signal is higher than a predetermined potential to be applied to an inversion input terminal of the voltage comparator 10, the voltage comparator 10 outputs a signal with logical level of "H", When the input signal is lower than the predetermined potential, the voltage comparator 10 outputs a signal with logical level of "L". It is necessary to set the predetermined potential to be a comparison potential to a value such that in the case where the input signal of over-modulation in the allowable range is input into the AM demodulator, the signal with logical level of "H" is not output from the voltage comparator 10.

The signal output from the voltage comparator 10 is input into the pulse generator 11. The pulse generator 11 is a circuit for generating a pulse only when the input signal shows the logical level of "H". The pulse output from the pulse generator 11 is input into the switch 12. The switch 12 is means which is turned off when the input signal shows logical level of "H". For example, the switch 12 is arranged on a signal line which connects the APC detection circuit 2 and the APC filter 3, and in the off state of the switch 12, it cuts off a feedback loop of the PLL circuit 30.

When the feedback loop of the PLL circuit 30 is cut off by the switch 12, the operation of the APC detection circuit 2 is reset, and the operation of the APC detection circuit 2 locks PLL in a new state. Since the pulse output from the pulse generator 11 is generated continuously until PLL is properly locked, PLL is finally locked properly. As a result, PLL can be avoided from being locked improperly.

The above embodiment described the case where the detection is made by the waveform on the side lower than the non-signal potential, namely, the detection is made by the detection signal with phase shifted by 180 degrees from the input signal. However, in the case where the detection is made by a waveform on a side higher than the non-signal potential, namely, the detection is made by a detection signal with the same phase as the input signal, the signal output from the AM detection circuit 1 is input into the inversion input terminal of the voltage comparator 10, and an appropriately low comparison potential is applied to the non-inversion terminal.

As explained above, according to the AM demodulator of the first embodiment, when the two signals which are compared in the APC detection circuit 2 are squared, even if the phase of the input signal or the phase of the signal output from VCO is shifted by 180 degrees, the detection signal, the phase of which is not inverted, can be generated. Further, in the case where the signal detected by the AM detection circuit 1 has a potential which is not less than the predetermined potential showing over-modulation, the feedback loop of the PLL circuit 30 is stopped. For this reason, the detected result can be prevented from being inverted even at the time of over-modulation, and the more stable AM demodulation can be realized.

There will be explained below the AM demodulator according to a second embodiment. The AM demodulator according to the second embodiment is characterized in that the two signals to be compared are raised to the fourth power in the APC detection circuit shown in the first embodiment. The other parts are as described in the first embodiment.

Figure 3:
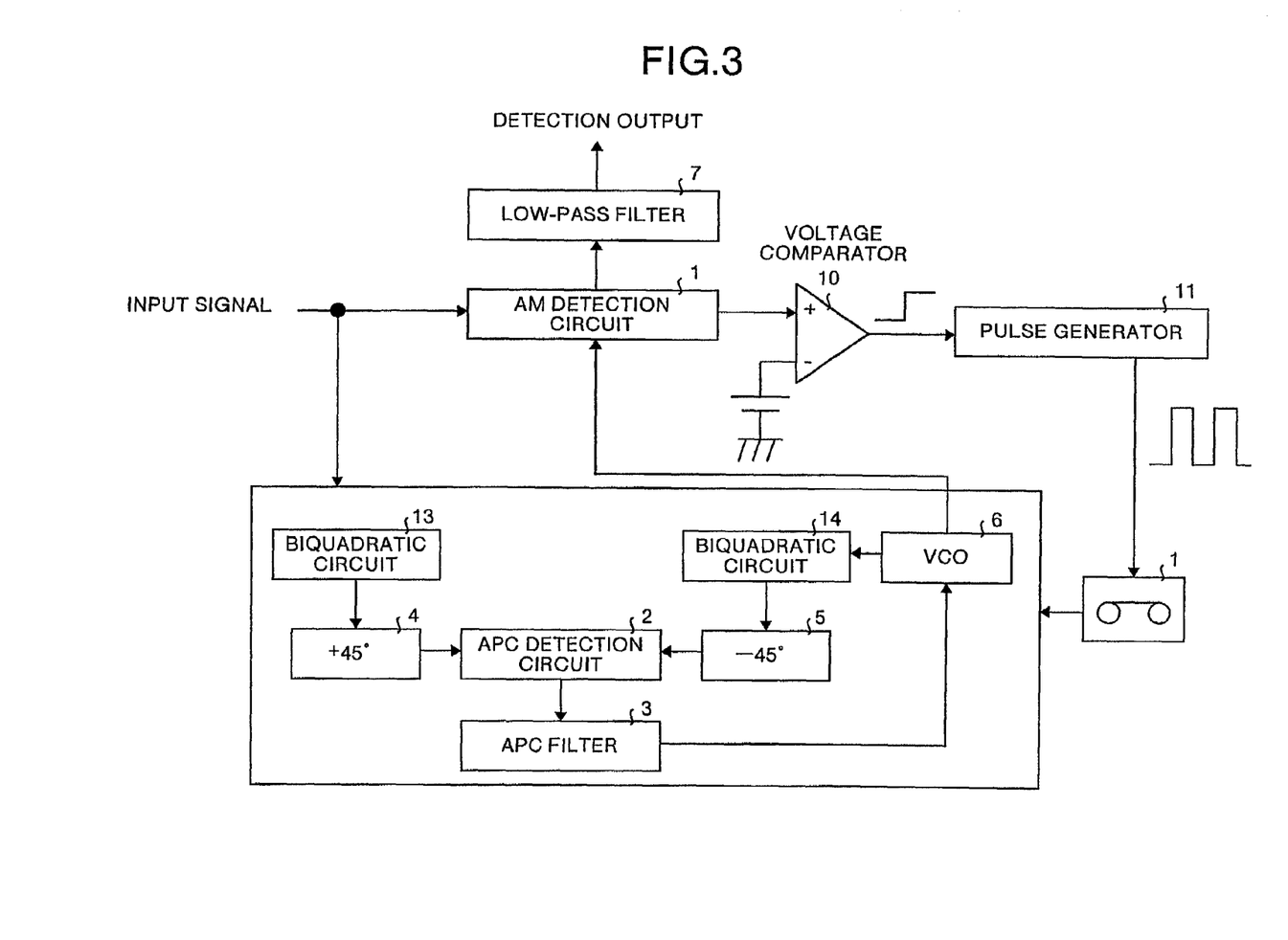
FIG. 3 is a block diagram showing a schematic structure of the AM demodulator according to a second embodiment.

FIG. 3 is a block diagram sowing a schematic structure of the AM demodulator according to the second embodiment. In FIG. 3, the same reference numerals are given to the common parts with FIG. 1, and the explanation thereof is omitted. The difference between the structure shown in FIG. 3 and that shown in FIG. 1 is, that instead of the multipliers 8 and 9, biquadratic circuits 13 and 14 are provided.

As explained in the first embodiment, since a signal with certain frequency is squared so that a signal with phase shifted by 180 degrees has the same phase. For this reason, also in the case where a signal is raised to the fourth power, the signal with phase shifted by 180 degrees has the same phase, and the signals are compared by the APC detection circuit 2 so that AM demodulation where inversion does not occur even at the time of over-modulation can be realized similarly to the first embodiment.

However, in the case where APC detection is made by the signal raised to the fourth power, when PLL is locked, four phase relationships are established such as the same phase, a difference of 90 degrees, a difference of 180 degrees and a difference of 270 degrees on the basis of the original signal. Since the cases of the same phase and the difference of 180 degrees are the same as in the first embodiment, an output (vout 90) at the time of the difference of 90 degrees and an output (vout 270) at the time of the difference of 270 degrees are represented by the following equations:

$$vout90 = \{Vc + Vs \times \cos\ \{\omega S \times t\}\} \times V0 \times \sin\ \{2 \times \omega c \times t\}/2;$$
and
$$vout270 = -vout90.$$

Namely, it is found that the output (vout 90) of the AM detection circuit 1 at the time of the difference of 90 degrees and the output (vout 270) of the AM detection circuit 1 at the time of the difference of 270 degrees are the same as the case where the frequency of the carrier is doubled.

Figure 4A:
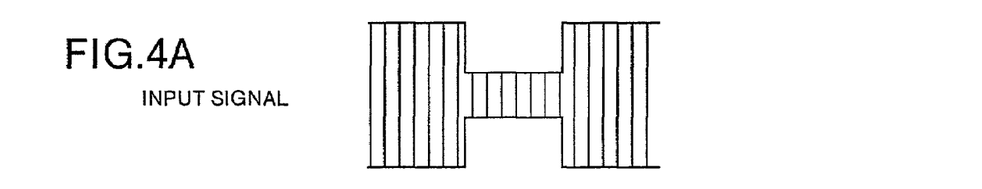
FIG. 4A to FIG. 4E are explanatory diagrams for explaining a signal to be output from the AM detection circuit in the AM demodulator according to the second embodiment.
Figure 4B:
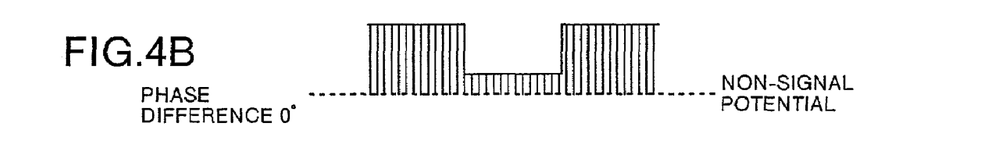
Figure 4C:
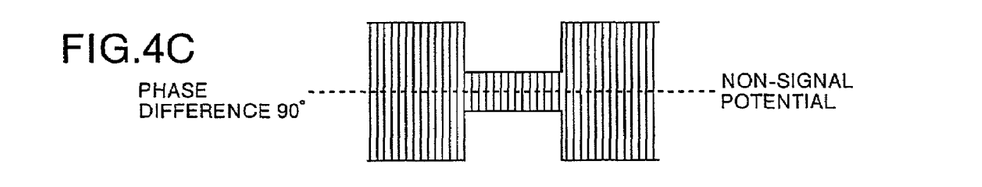
Figure 4D:
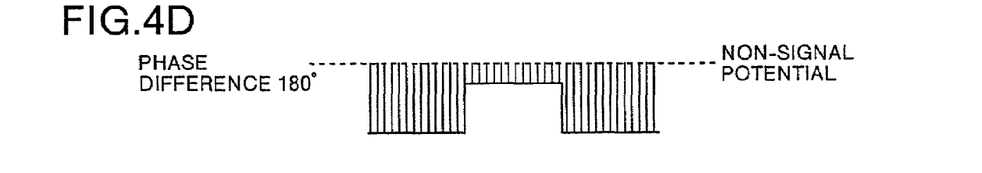
Figure 4E:
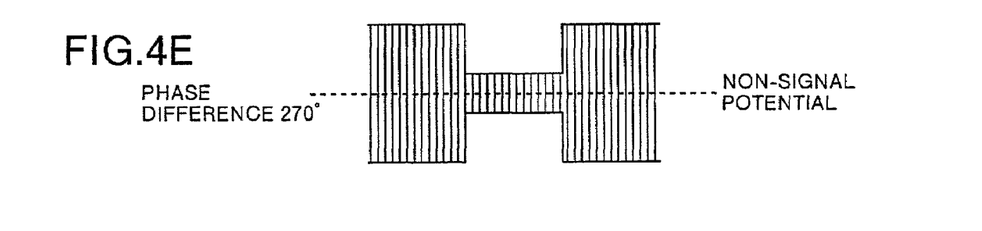

FIG. 4A to FIG. 4E are explanatory diagrams for explaining a signal to be output from the AM detection circuit 1 in the AM demodulator according to the second embodiment. FIG. 4B and FIG. 4D correspond to FIG. 2B and FIG. 2C respectively, therefore, their description will be omitted in order to avoid repetition of explanation. As shown in FIG. 4C and FIG. 4E, in the case of the phase difference 90 degrees and the phase difference 270 degrees, PLL is not appropriately locked by the PLL circuit 30, but in these cases, an output appears on the opposite side of an ideal output with respect to the non-signal potential. For this reason, the voltage comparator 10, the pulse generator 11 and the switch 12 used in the first embodiment are used so that PLL can be finally locked appropriately according to the same principle as the first embodiment.

When a 2n-th power circuit (n=1, 2, 3, ...) is used instead of the biquadratic circuit, the same effect can be obtained. However, as n increases, a number of points to be locked increases, and thus taking waveforms at that time into consideration, it is necessary to make a detection at the time of error locking.

As explained above, according to the AM demodulation of the second embodiment, in the case where the 2n-th power circuit for raising the input signal or the signal output from the VCO 6 to the 2n-th (n=1, 2, 3, ...) power is provided instead of the multiplier explained in the first embodiment, the same effect as the first embodiment can be obtained.

There will be explained below the AM demodulator according to a third embodiment. The first and second embodiments are characterized in that the PLL loop is cut off to be reset at the time of over-modulation, and the operation of the APC detection circuit is again performed so that PLL is finally locked with appropriate phase relationship. However, in this system, as to whether or not PLL is appropriately locked depends on probability, and thus the secure and appropriate locking is not always ensured. Therefore, the AM demodulator according to the third embodiment is characterized in that two APC detection circuits are provided, and one APC detection circuit is usually used so as to make APC detection using squared signals, and in the case where PLL is not properly locked and the output is inverted, the APC detection is made by using the original signals which are not squared.

Figure 5:
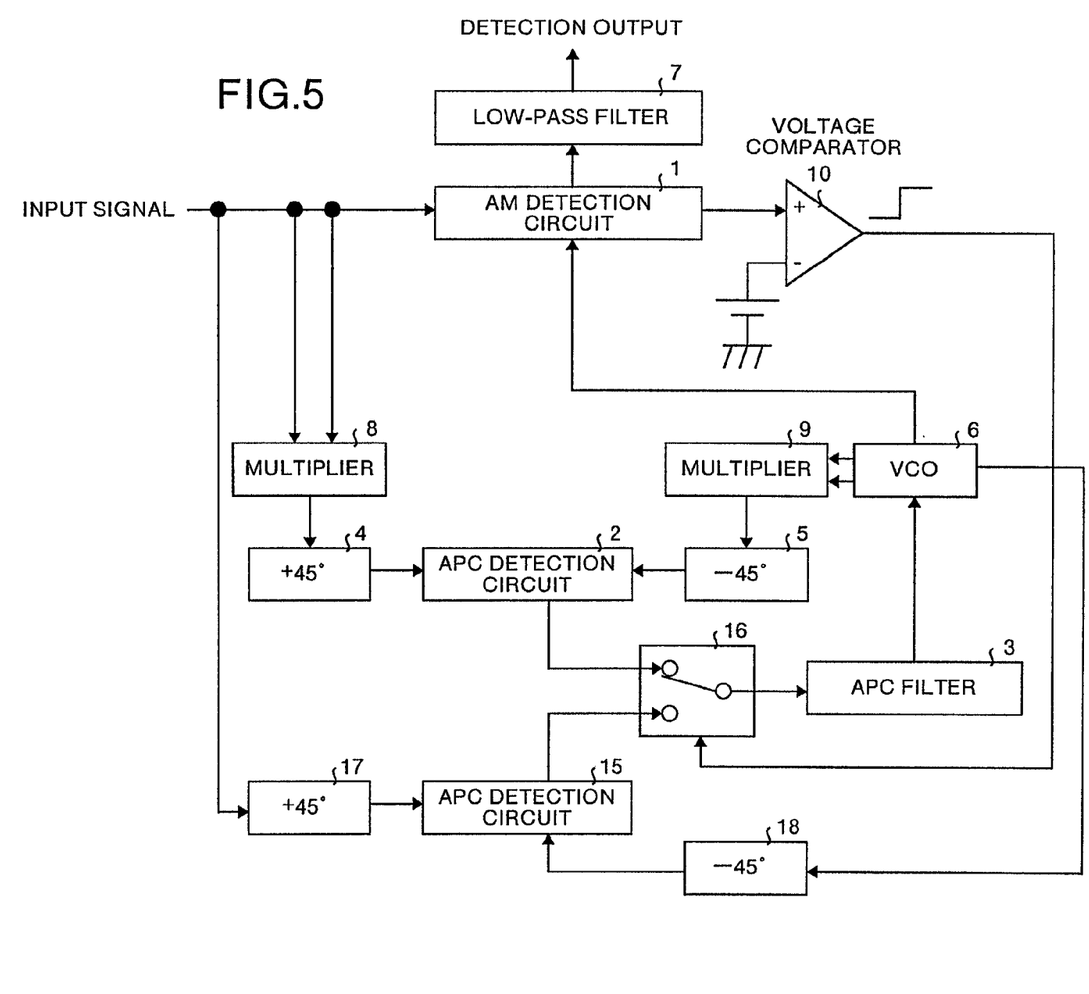
FIG. 5 is a block diagram showing a schematic structure of the AM demodulator according to a third embodiment.

FIG. 5 is a block diagram showing a schematic structure of the AM demodulator according to the third embodiment. In FIG. 5, the same reference numerals are given to the common parts with FIG. 1, and the explanation thereof is omitted. In the AM demodulator shown in FIG. 5, the pulse generator 11 and the switch 12 shown in FIG. 1 are eliminated, the difference from FIG. 1 is that phase shift circuits 17 and 18, an APC detection circuit 15 and a switch 16 are provided. The phase shift circuit 17 shifts the phase of the input signal input into the AM demodulator by +45 degrees. The phase shift circuit 18 shifts the phase of the signal output from the VCO 6 by −45 degrees. The APC detection circuit 15 inputs the signal output from the phase shift circuit 17 and the signal output from the phase shift circuit 18 so as to compare their phases. The switch 16 inputs one of compared results of the APC detection circuit 2 and the APC detection circuit 15 into the APC filter 3 according to the signal output from the voltage comparator 10.

Particularly in FIG. 5, the APC detection circuit 2 serves as a first APC detection circuit which makes the same APC detection as the first embodiment in the case where an over-modulation state is not detected by the voltage comparator 10. The APC detection circuit 15 serves as a second APC detection circuit which makes APC detection in the case where the over-modulation state is detected by the voltage comparator 10.

Namely, the APC detection circuit 15 is used when PLL is locked so that PLL is appropriately locked similarly to the conventional system. When PLL is appropriately locked, the switch 16 switches to the APC detection circuit 2. Particularly in the state that the APC detection circuit 15 is stable, namely, the phase difference of two inputs to the APC detection circuit 15 is 90 degrees, since the phase difference of the two inputs to the APC detection circuit 2 is also 90 degrees, the circuit 2 is in the stable state. Therefore, even when the switch 16 switches a system for performing APC operation, the normal locked state can be maintained.

As explained above, according to the AM demodulator of the third embodiment, even in the case where the over-modulation state is detected in the voltage comparator 10, the APC operation is performed after the APC detection circuit 2 is switched to the APC detection circuit 15 for inputting original signals to be compared (signals which are not squared). For this reason, PLL can be securely locked without cutting off the APC operation, namely, PLL control.

There will be explained below the AM demodulator according to a fourth embodiment. The AM demodulator according to the fourth embodiment is characterized in that the two signals which are compared by the first APC detection circuit are raised to the fourth power in the APC detection circuit explained in the third embodiment. The other parts are as explained in the third embodiment.

Figure 6:
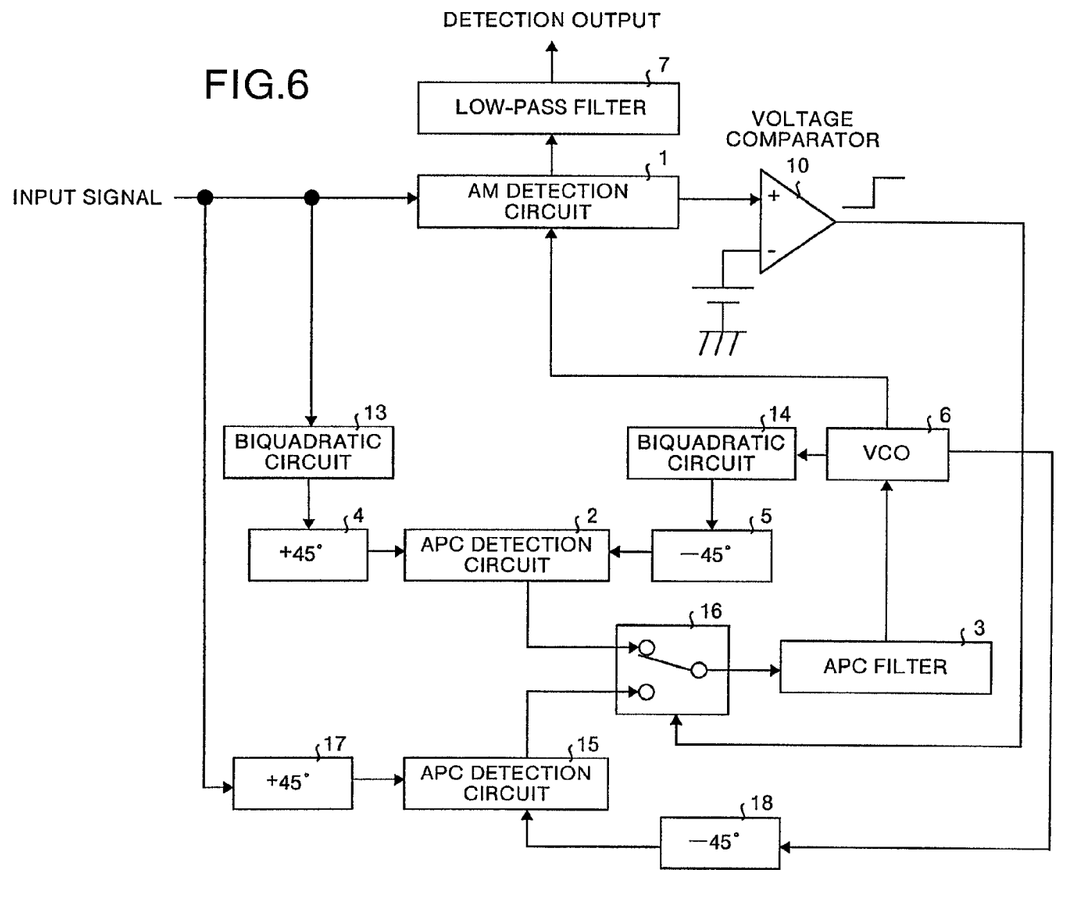
FIG. 6 is a block diagram showing a schematic structure of the AM demodulator according to a fourth embodiment.

FIG. 6 is a block diagram showing a schematic structure of the AM demodulator according to the fourth embodiment. In FIG. 6, the same reference numerals are given to the common parts with FIG. 5, and the description thereof is omitted. In FIG. 6, the difference from FIG. 5 is that biquadratic circuits 13 and 14 are provided instead of the multipliers 8 and 9.

As explained in the first embodiment, the signal is squared so that the signal, a phase of which is shifted by 180 degrees, has the same phase. For this reason, in the case where the signal is raised to the fourth power, the signal, a phase of which is shifted by 180 degrees, has the same phase and is APC-detected so that the AM demodulator where inversion does not occur even at the time of over-modulation can be realized as same as the third embodiment. In the case where APC detection is made by the signals raised to the fourth power, when PLL is locked, four phase relationship are established such as the same phase, a difference of 90 degrees, a difference of 180 degrees and a difference of 270 degrees. However, as for this point, PLL can be appropriately locked according to the same principle explained in the second embodiment.

As explained in relation to the second embodiment, in the case where 2n-th power circuits (n=1, 2, 3, . . . ) are used in stead of the biquadratic circuits, the same effect can be obtained.

As explained above, according to the AM demodulator of the fourth embodiment, even in the case where 2n-th power circuits for raising the input signal or the signal output from the VCO 6 to the 2n-th (n=1, 2, 3, . . . ) power are provided instead of the multiplier explained in the third embodiment, the same effect as the third embodiment can be obtained.

There will be explained below the AM demodulator according to a fifth embodiment. The AM demodulator according to the fifth embodiment is characterized in that in the case where the compared result of the first APC detection circuit for making APC detection using the squared signal to be compared is always input into the APC filter and PLL is not properly locked and thus the output is inverted in the third embodiment, the compared result of the second APC detection circuit for making APC detection using the original signal which is not squared is input into the APC filter.

Figure 7:
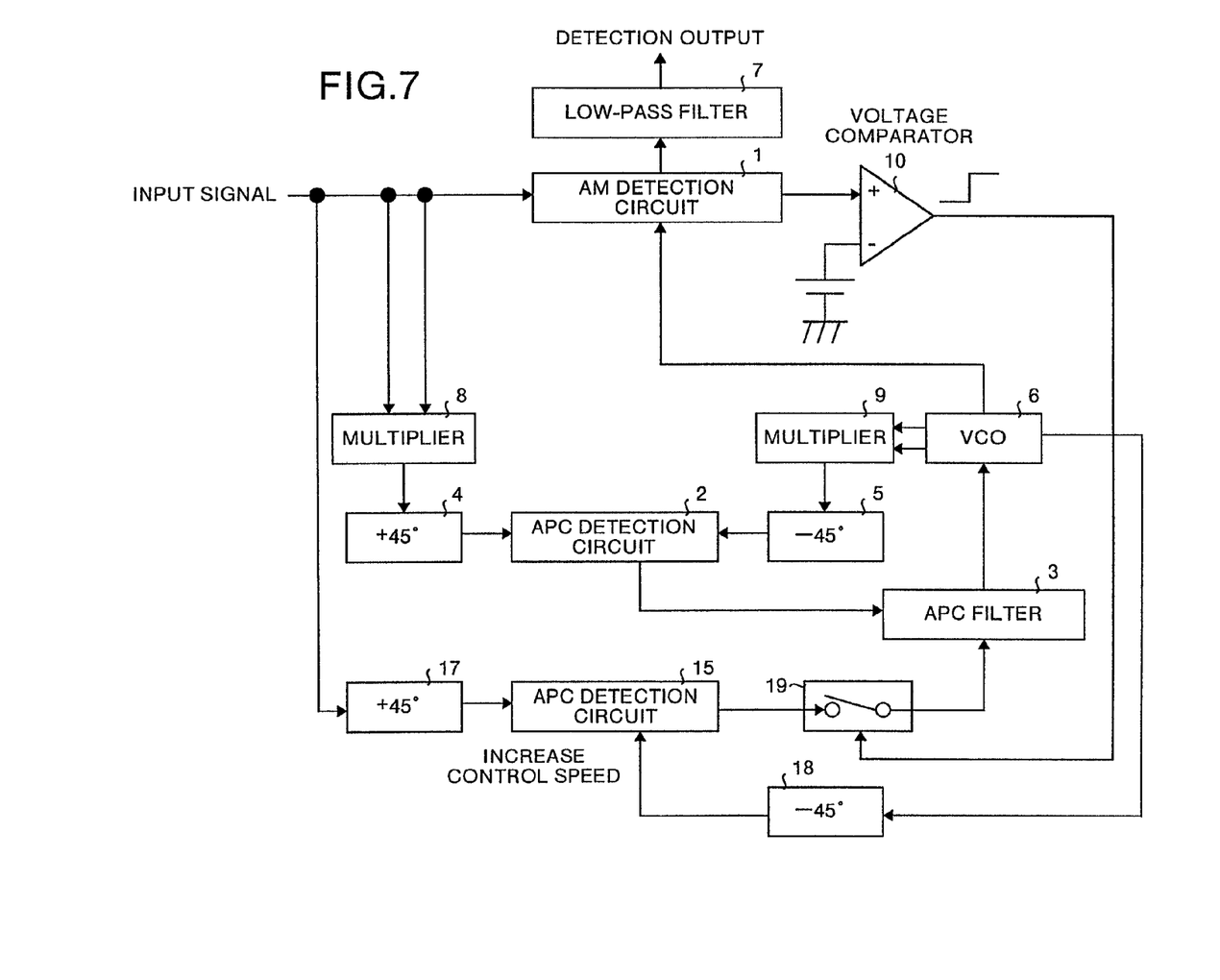
FIG. 7 is a block diagram showing a schematic structure of the AM demodulator according to a fifth embodiment.

FIG. 7 is a block diagram showing a schematic structure of the AM demodulator according to the fifth embodiment. In FIG. 7, the same reference numerals are given to the parts common with FIG. 5, and the explanation thereof is omitted. In the AM demodulator shown in FIG. 7, the difference from FIG. 5 is that the switch 16 is eliminated and a switch 19 is provided. The signal output from the APC detection circuit 2 is always input into the APC filter 3, the switch 19 switches as to whether or not the compared result of the APC detection circuit 15 is input into the APC filter 3 according to the signal output from the voltage comparator 10.

Namely, the APC detection circuit 2 always makes APC detection, and only the compared result of the APC detection circuit 15 is input into the APC filter 3 by the operations of the voltage comparator 10 and the switch 19. At this time, both the circuits are designed so that the control speed of the APC detection circuit 15 is higher than the control speed of the APC detection circuit 2. As a result, when over-modulation is detected, the APC detection circuit 15 becomes superior to the APC detection circuit 2, and PLL is locked so that the appropriate phase relationship is established by the APC detection circuit 15.

As explained above, according to the AM demodulator of the fifth embodiment, since the compared result of the APC detection circuit 2 is always input into the APC filter 3, the potential of the APC filter 3 becomes table by the PLL operation by means of the APC detection circuit 2. When the input signal of over-modulation is input into the AM demodulator, the potential due to the compared result output from the APC detection circuit 15 is superposed on the potential of the APC filter 3. For this reason, similarly to the third embodiment, the switch 16 switches the APC detection circuit so that the potential of the APC filter 3 fluctuates. As a result, a danger that a bad influence is exerted on the output is eliminated, and thus the more smooth and stable PLL operation can be realized.

There will be explained below the AM demodulator according to a sixth embodiment. The AM demodulator according to the sixth embodiment is characterized in that the two signals which are compared by the first APC detection circuit are raised to the fourth power in the APC detection circuit described in the fifth embodiment. The other parts are as explained in the fifth embodiment.

Figure 8:
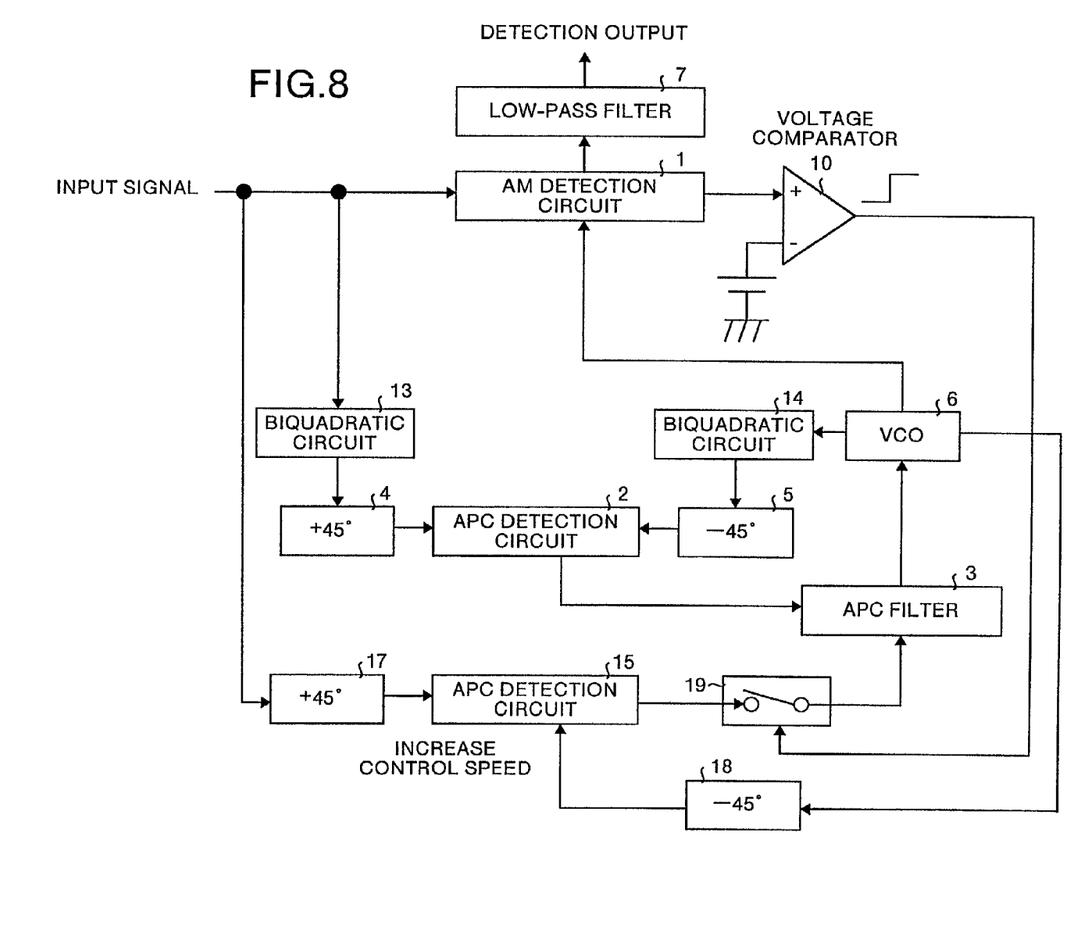
FIG. 8 is a block diagram showing a schematic structure of the AM demodulator according to a sixth embodiment.

FIG. 8 is a block diagram showing a schematic structure of the AM demodulator according to the sixth embodiment. In FIG. 8, the same reference numerals are given to the parts common with FIG. 7, and the explanation thereof is omitted. In FIG. 8, the difference from FIG. 7 is that biquadratic circuits 13 and 14 are provided instead of the multipliers 8 and 9.

As explained in the first embodiment, since the signals are squared so that the signal, a phase of which is shifted by 180 degrees has the same phase, even in the case where the signal is raised to the fourth power, the signal, a phase of which is shifted by 180 degrees, has the same phase. When the signal with the fourth-power raised phase is APC-detected, similarly to the fifth embodiment, the AM demodulator where an output is not inverted at the time of over-modulation can be realized. In the case where APC detection is made by using the fourth-power signal, when PLL is locked, four phase relationships are established such as the same phase, the difference of 90 degrees, the difference of 180 degrees and the difference of 270 degrees. As for this point, PLL can be appropriately locked according to the same principle explained in the second embodiment.

Similarly to the second embodiment, the 2n-th power circuits (n=1, 2, 3, . . . ) are used instead of the biquadratic circuits, the same effect can be obtained.

As explained above, according to the AM demodulator of the sixth embodiment, in the case where the 2n-th power circuit for raising the input signal or the signal output from VCO 6 to the 2n-th (n=1, 2, 3, . . . ) power is provided instead of the multiplier explained in the fifth embodiment, the same effect as the fifth embodiment can be obtained.

There will be explained below the AM demodulator according to a seventh embodiment. The AM demodulator according to the seventh embodiment is characterized in that the signals to be input into the multipliers are shifted by different phases in the fifth embodiment.

Figure 9:
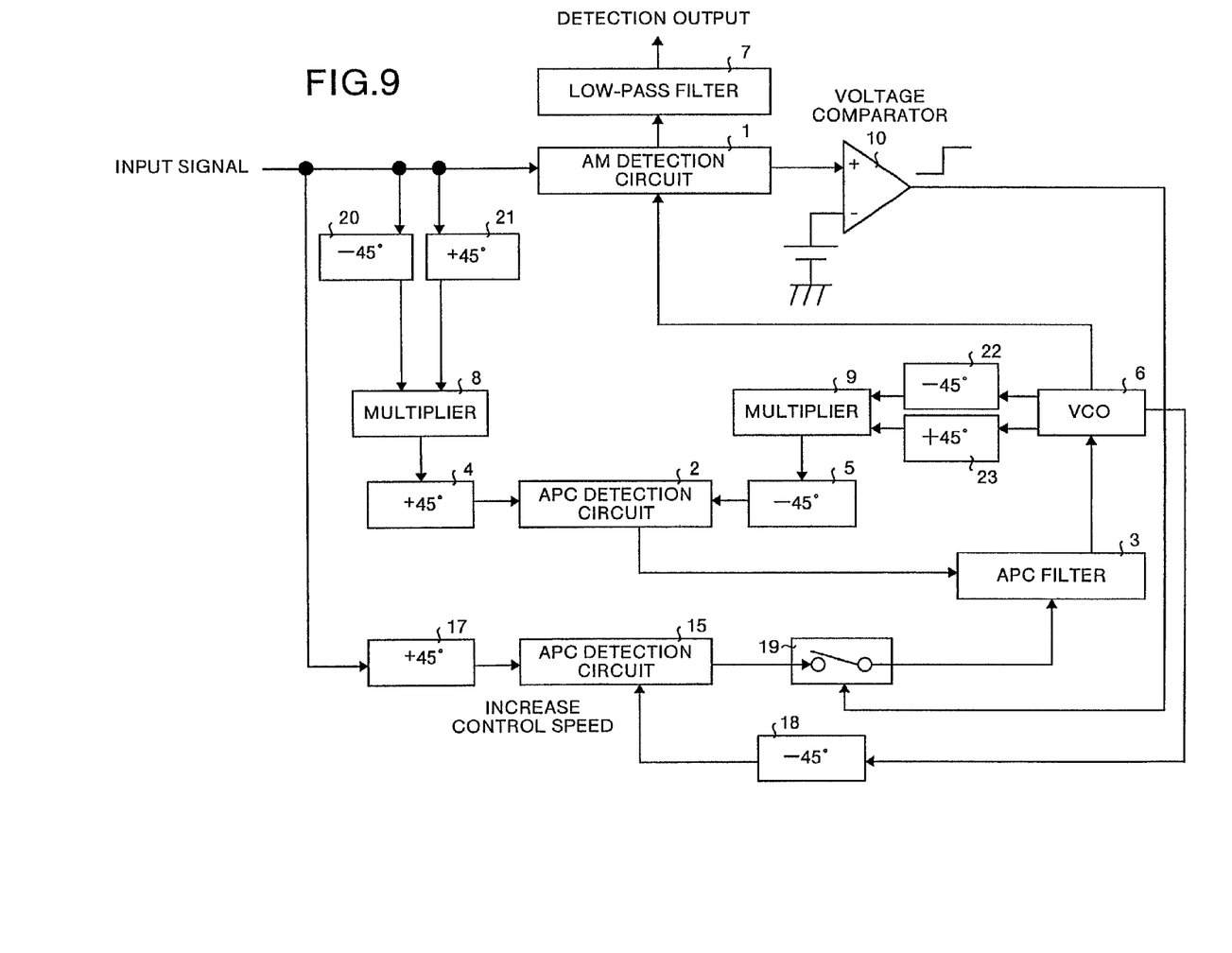
FIG. 9 is a block diagram showing a schematic structure of the AM demodulator according to a seventh embodiment.

FIG. 9 is a block diagram showing a schematic structure of the AM demodulator according to the seventh embodiment. In FIG. 9, the same reference numerals are given to the parts common with FIG. 7, and the explanation thereof will be omitted. In the AM demodulator shown in FIG. 9, the difference from FIG. 7 is that phase shift circuits 20, 21, 22 and 23 are provided. The phase shift circuit 20 shifts the phase of the input signal input into the AM demodulator by −45 degrees. The phase shift circuit 21 shifts the phase of the input signal by +45 degrees. The phase shift circuit 22 shifts the phase of the signal output from the VCO 6 by −45 degrees. The phase shift circuit 23 shifts the phase of the signal output from the VCO 6 by +45 degrees.

In the fifth embodiment, since the two signals input to the multipliers 8 and 9 have the same phase, when the signal to be input is cos A, the result of squaring the signal becomes:

$$\cos A \times \cos A = \tfrac{1}{2} + \tfrac{1}{2} \times \cos 2A.$$

The result has a change in DC component shown in the first term.

The change in DC component gives a fluctuation to the control potential of the VCO 6 so that a band influence is possibly exerted on the output. Therefore, in the AM demodulator according to the seventh embodiment, in order to prevent this, the phase shift circuits 20, 21, 22 and 23 are used so that a phase difference between the two signals to be input into the multipliers 8 and 9 respectively becomes 90 degrees. As a result, the outputs of the multipliers 8 and 9 become:

$$\cos A \times \cos \{A+90 \text{ degrees}\} = \tfrac{1}{2} \times \sin 2A.$$

As a result, the change in the DC component can be eliminated.

The example shown in FIG. 9 shows the structure that the phase shift circuits 20, 21, 22 and 23 added to the structure shown in FIG. 7. However, the same example can be applied also to the structures shown in FIG. 1 and FIG. 5.

As explained above, according to the AM demodulator of the seventh embodiment, since the two signals to be input into the multipliers are shifted so that their phase becomes 90 degrees. For this reason, the change in DC component can be eliminated from the outputs of the multipliers 8 and 9. As a result, the more stable PLL operation can be realized.

As explained above, according to one aspect of the invention, instead that the input signal and the output of the voltage control oscillator are directly used so that APC detection is made, the input signal and the output are raised to 2n-th power and APC detection is made. As a result, the signal shifted by 180 degrees has the same phase, and even if the input signal is shifted by 180 degrees at the time of over-modulation, the phase does not follow this so that inversion of the output at the time of over-modulation can be eliminated. Therefore, more stable AM demodulation can be carried out.

According to another aspect, the phase lock loop is not cut off at the time of detecting over-modulation, and the other phase lock loop can be maintained by conventional APC detection. As a result, more stable AM demodulation can be carried out.

According to another aspect, the phase lock loop is not cut off at the time of detecting over-modulation, and while the phase lock loop which has been continued is maintained, it can be switched to the other phase lock loop by the conventional APC detection. As a result, more stable AM demodulation can be carried out.

According to another aspect, the DC component generated due to multiplication can be eliminated. As a result, more stable AM demodulation can be realized.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An AM demodulator that receives and demodulates an AM modulated input signal using a wave-detection signal generated by a phase locked loop, said AM demodulator comprising:
   a voltage controlled oscillator which outputs a wave-detection signal;
   a phase locked loop including
      a detection unit which detects whether a detection signal, obtained by AM wave-detection of the wave-detection signal, has a specific relationship with respect to a threshold amplitude level;
      a first multiplying unit which raises an AM modulated input signal to a 2n-th power, where n is an integer and at least 1;
      a second multiplying unit which raises the wave-detection signal output from said voltage controlled oscillator to the 2n-th power; and
      a phase control unit providing phase control using outputs of said first and second multiplying units; and
   a switching unit which resets said phase locked loop in response to the detection signal.

2. The AM demodulator according to claim 1, further comprising:
   a first phase shift unit which generates, based on the AM modulated input signal, two signals that have a phase difference of 90 degrees; and
   a second phase shift unit which generates, based on the wave-detection signal output from said voltage controlled oscillator, two signals that have a phase difference of 90 degrees, wherein said first multiplying unit processes the two signals generated by said first phase shift unit, and said second multiplying unit processes the two signals generated by said second phase shift unit.

3. An AM demodulator that receives and demodulates an AM modulated input signal using a wave-detection signal generated by a phase locked loop, said AM demodulator comprising:

- a voltage controlled oscillator which outputs a wave-detection signal;
- a detection unit which detects whether a detection signal, obtained by AM wave-detection of the wave-detection signal, has a specific relationship with respect to a threshold amplitude level;
- a first multiplying unit which raises an AM modulated input signal to a 2n-th power, where n is an integer and at least 1;
- a second multiplying unit which raises the wave-detection signal output from said voltage controlled oscillator to the 2n-th power;
- a first phase control unit providing phase control using outputs of said first and second multiplying units;
- a second phase control unit providing phase control using the wave-detection signal output from said voltage controlled oscillator;
- a filter unit which generates a signal for controlling said voltage controlled oscillator and
- a selection unit which selects a signal output from one of said first phase control unit and said second phase control unit in response to the detection signal and provides the signal selected to said filter unit.

4. The AM demodulator according to claim 3, further comprising:

- a first phase shift unit which generates, based on the AM modulated input signal, two signals that have a phase difference of 90 degrees; and
- a second phase shift unit which generates, based on the wave-detection signal output from said voltage controlled oscillator, two signals that have a phase difference of 90 degrees, wherein said first multiplying unit processes, the two signals generated by said first phase shift unit, and said second multiplying unit processes the two signals generated by said second phase shift unit.

5. An AM demodulator that receives and demodulates an AM modulated input signal using a wave-detection signal generated by a phase locked loop, said AM demodulator comprising:

- a voltage controlled oscillator which outputs a wave-detection signal;
- a detection unit which detects whether a detection signal, obtained by AM wave-detection of the wave-detection signal, has a specific relationship with respect to a threshold amplitude level;
- a first multiplying unit which raises an AM modulated input signal to a 2n-th power, where n is an integer and at least 1;
- a second multiplying unit which raises the wave-detection signal output from said voltage controlled oscillator to the 2n-th power;
- a first phase control unit providing phase control using outputs of said first and second multiplying units;
- a second phase control unit providing phase control using the wave-detection signal output from said voltage controlled oscillator;
- a filter unit which generates a signal for controlling said voltage controlled oscillator; and
- a switching unit which provides a signal output by said second phase control unit to said filter unit in response to the detection signal.

6. The AM demodulator according to claim 5, further comprising:

- a first phase shift unit which generates, based on the AM modulated input signal, two signals that have a phase difference of 90 degrees; and
- a second phase shift unit which generates, based on the wave-detection signal output from said voltage controlled oscillator, two signals that have a phase difference of 90 degrees, wherein said first multiplying unit processes the two signals generated by said first phase shift unit, and said second multiplying unit processes the two signals generated by said second phase shift unit.

* * * * *